United States Patent [19]
Nelson

[11] Patent Number: 4,734,594
[45] Date of Patent: Mar. 29, 1988

[54] OFFSET CORRECTION FOR SENSOR WITH TEMPERATURE DEPENDENT SENSITIVITY

[75] Inventor: Richard W. Nelson, Freeport, Ill.

[73] Assignee: Honeywell Inc., Minneapolis, Minn.

[21] Appl. No.: 948,208

[22] Filed: Dec. 31, 1986

[51] Int. Cl.[4] .......................... H03K 17/90; H03K 3/43
[52] U.S. Cl. ..................................... 307/309; 307/310; 323/368
[58] Field of Search ................ 307/309, 310; 323/294, 323/368; 330/6

[56] References Cited

U.S. PATENT DOCUMENTS

| | | | |
|---|---|---|---|
| 3,671,767 | 6/1972 | Davis | 307/309 |
| 4,371,837 | 2/1983 | Sieverin | 307/309 |
| 4,521,727 | 6/1985 | Atherton et al. | 307/309 |

OTHER PUBLICATIONS

Hall Cell Bias and Offset Circuit", J. E. Gersbach, IBM Tech. Disclosure Bulletin, vol. 20, No. 6, 1977, pp. 2149 and 2150.

*Primary Examiner*—Stanley D. Miller
*Assistant Examiner*—B. P. Davis
*Attorney, Agent, or Firm*—Charles L. Rubow

[57] ABSTRACT

A Hall effect device with offset compensation in which the output terminals of a Hall effect element formed in an epitaxial layer are connected to a differential current source. The sum of first and second currents produced by the source is determined by a resistor formed in the epitaxial layer in which the Hall effect element is formed and which is powered by the same electrical source as the Hall effect element so as to produce a current which tracks the current through the Hall effect element with temperature. The current through the resistor is split by a pair of trimmable temperature insensitive resistors and supplied to a pair of cross-coupled current mirrors which supply the currents to the output terminals of the Hall effect element.

18 Claims, 1 Drawing Figure

U.S. Patent
Mar. 29, 1988
4,734,594
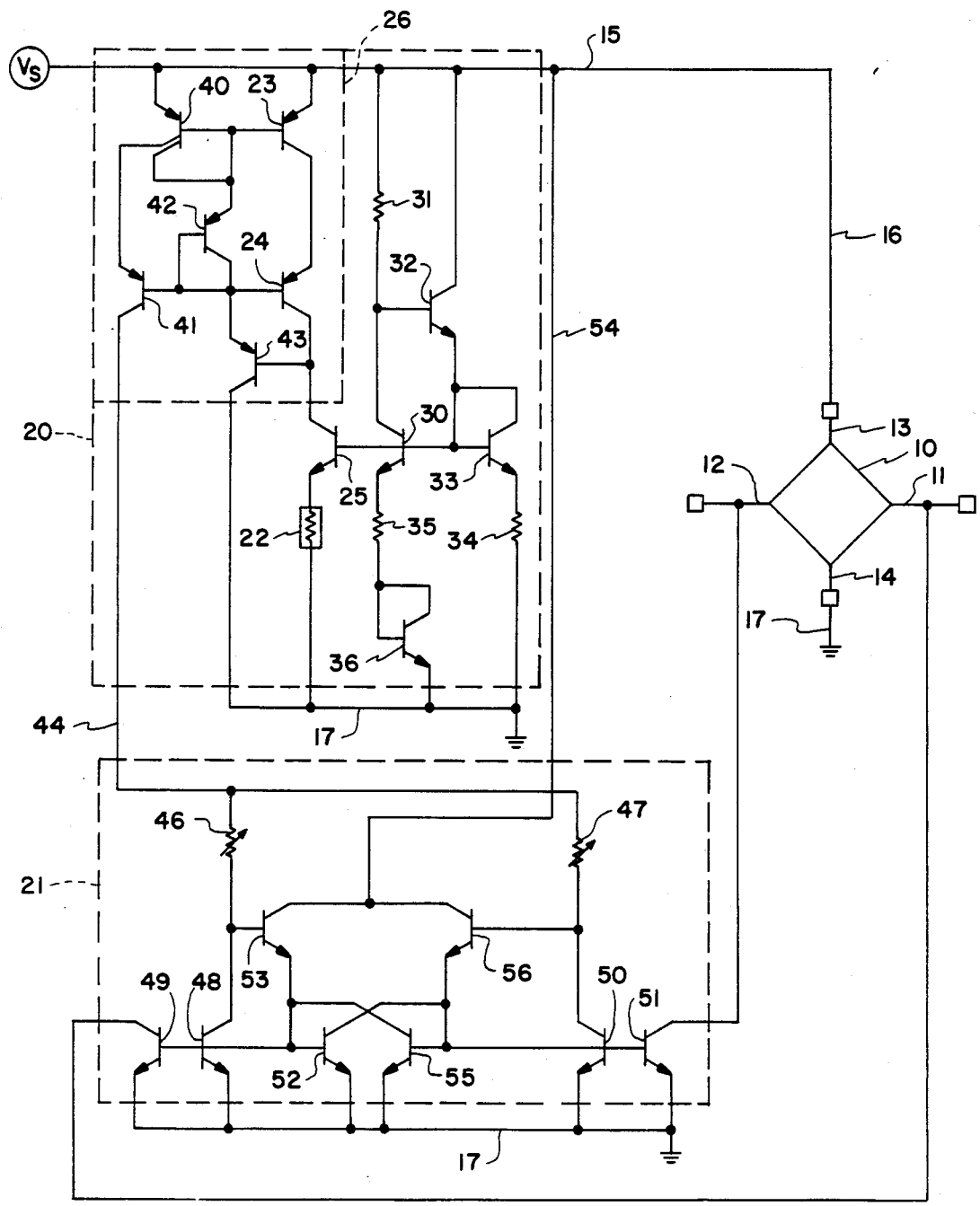

OFFSET CORRECTION FOR SENSOR WITH TEMPERATURE DEPENDENT SENSITIVITY

BACKGROUND OF THE INVENTION

The invention disclosed herein relates generally to offset correction for electrically powered sensors whose outputs may exhibit undesired offsets due to fabrication process variations, and more particularly to a method and circuit for providing offset correction which accommodates the temperature dependent sensitivity of an integrated circuit Hall effect or similar sensor.

Hall effect sensors are recognized as offering substantial advantages in many sensing applications. For some time, such sensors have been widely used where an on-off or binary output is required or acceptable. Hall effect sensors have also been used in various applications requiring analog outputs. However, such uses have been limited because the output voltage of a Hall element is so low that amplification is required, and, since the Hall element sensitivity varies with temperature, the amplification must be made to vary with temperature in a compensating manner. Further, since it is preferred that any amplifier used with the Hall element operate about the center of its operating range, provisions for offset correction are required. Compensation for these characteristics can be provided with suitable compensation circuitry. However, the task is complicated by the requirement for precise temperature dependency relationships. In particular, the sensitivity of a Hall element is quite temperature dependent. Thus, in order to achieve a linear output in applications in which the temperature is not constant, it is necessary that the associated amplifier exhibit a complementary temperature dependent gain characteristic.

The offset exhibited by a Hall element appears as a nonzero output voltage when no magnetic field is applied. It is known that this offset can be cancelled by causing electric currents of the proper magnitudes to flow through the output terminals. However, the proper magnitudes of currents also depend on temperature. In order to achieve compensation, the temperature dependency of these currents must track the temperature dependency of the Hall effect device. A further requirement is that these currents be adjustable to permit trimming of the device to a zero or other desired predetermined offset after manufacture since it cannot be predicted beforehand what the offset will be.

One approach to providing offset compensation is to control the currents through the Hall element output terminals by means of a control signal having the same temperature dependency as the Hall effect device. Such a control signal can be generated by a resistor having the same temperature characteristics has the Hall effect device supplied with power from the same source. Where the Hall effect device is part of an integrated circuit and is formed in an epitaxial layer, a resistor for producing the offset current control signal can be formed advantageously in the same epitaxial layer, thus insuring that both the Hall effect device and the resistor have substantially identical temperature dependent characteristics. However, such construction results in a problem, since such a resistor cannot be trimmed after it is formed to the value required for eliminating any offset which may exist.

The applicant has devised a unique integrated circuit Hall effect device in which the Hall effect element and resistor for producing a contol current are formed in the same epitaxial layer, and which also permits precise adjustment of currents through the Hall effect element output terminals.

SUMMARY OF THE INVENTION

The invention is a method of providing temperature independent output voltage offset compensation for an integrated circuit Hall effect element, and a Hall effect device embodying the method. The device comprises a Hall effect element and a first resistor both formed in an epitaxal layer on a semiconductor chip and means connecting the element and first resistor between the same power supply conductors. Current control means responsive to the current through the first resistor is provided for controlling the current through at least one of the output terminals of the Hall effect element. The current control means may comprise an additional resistor connected to each output terminal of the Hall effect device, the additional resistors having substantially identical temperature dependencies and at least one of the additional resistors being variable, and cross coupled current mirrors connected to control the currents through the additional resistors in response to the current through the first resistor.

The method comprises providing a resistor having substantially the same temperature response as a Hall effect element for which offset compensation is desired, supplying the input terminals of the Hall effect element and the resistor with electric current from the same source, dividing the current through the resistor into first and second complementary current portions, controlling current flow through first and second output terminals of the Hall effect element in response to the first and second current portions respectively, and adjusting the ratio of the first and second current portions to achieve a null output voltage from the Hall effect element when no magnetic field is applied.

BRIEF DESCRIPTION OF THE DRAWING

The single FIGURE of the drawing is a schematic circuit diagram of a Hall effect device including an offset compensation circuit in accordance with the applicant's invention.

DESCRIPTION OF THE PREFERRED EMBODIMENT

In the drawing reference numeral 10 identifies a Hall effect element having output terminals 11 and 12 between which a voltage is produced when an electric current is caused to flow between input terminals 13 and 14 and the element is subjected to a magnetic field. Hall effect element 10 may be formed of N-epitaxial material by conventional processes in an epitaxial layer on a semiconductor chip along with most of the offset compensation circuitry. The Hall effect element preferably contains two identical elements placed in an integrated circuit layout such that the supply current directions are orthogonal so as to reduce mechanical stress effects. In some situations it may be advantageous to use more than two elements.

Current is caused to flow between input terminals 13 and 14 by connecting terminal 13 to a voltage supply conductor 15 through a conductor 16 and connecting terminal 14 to a voltage reference conductor 17. Ideally no voltage is produced between output terminals 11 and 12 when no magnetic field is present. However, due to fabrication process nonuniformities and other factors, an offset voltage is generally present between output terminals 11 and 12 even in the absence of a magnetic field. Once a Hall effect element is fabricated the offset voltage characteristics are established. However, it is generally not possible to predict the offset beforehand.

It is known that the voltages at output terminals 11 and 12 can be varied by causing current to flow through the output terminals. Thus, the offset voltage can be reduced to zero by connecting at least one of the output terminals to an appropriate current source. However, as previously indicated, in order to maintain a zero or other desired offset voltage under all temperature conditions, the current produced through the output terminal must track the current through the Hall effect element between input terminals 13 and 14 with temperature. In the circuit shown, this is accomplished by means of a differential current source comprising a tracking circuit generally identified by reference numeral 20 and a current control circuit generally identified by reference numeral 21.

Tracking circuit 20 produces a current which tracks the current through Hall effect element 10 by employing an N-epitaxial resistor 22 formed by the same process as that used in forming the Hall effect element. Resistor 22 is supplied with current from the same source which supplies current to Hall effect element 10. Specifically, one end of resistor 22 is connected to voltage supply conductor 15 through series connected PNP transistors 23 and 24 and NPN transistor 25. The other end of resistor 22 is connected to reference voltage conductor 17. Transistors 23 and 24 are also components of a current mirror 26 which will be described in greater detail hereinafter. Transistor 25 is a component in a ratiometric current source reference which produces a current whose magnitude is independent of the base-emitter voltages of the transistors in the circuit.

In the preferred form shown, the current source reference comprises an NPN transistor 30 having its collector connected to supply conductor 15 through a resistor 31. The base drive signal for transistor 30 is supplied through an NPN transistor 32 having its collector connected directly to supply conductor 15, its base connected connected to the collector of transistor 30 and its emitter connected to the base of transistor 30 so as to provide base current loading compensation. The emitter of transistor 32 is also connected to reference voltage conductor 17 through an NPN transistor 33 arranged as a diode and a resistor 34. The diode thus formed matches the characteristics of transistor 30. The emitter of transistor 30 is connected to reference voltage conductor 17 through a resistor 35 and an NPN transistor 36 arranged as a diode. It can be shown that if the resistance of resistor 31 is twice the resistance of resistor 35, the base-emitter voltages of the transistors cancel out and the voltage at the emitter of transistor 30 is temperature independent and ratiometric with the supply voltage, i.e., always varies by the same percentage as the supply voltage.

The same base drive voltage is supplied to the base electrodes of both transistors 25 and 30. Therefore a ratiometric and temperature independent voltage is impressed across epitaxial resistor 22 to produce a current therethrough which tracks the current through Hall effect element 10 with temperature.

The current required by current control means 21 is a predetermined fraction of the current through resistor 22. Current mirror 26 is employed to supply the required current to control means 21. Current mirror 26 comprises transistor 23 and a PNP transistor 40 having their base electrodes connected together and their emitter electrodes connected to supply conductor 15. Thus, the current through resistor 22 flows through the emitter and collector electrodes of transistor 23, and a proportional current flows through the emitter and collector electrodes of transistor 40 and to current control means 21.

Current mirror 26 must be very stable with respect to temperature. Transistors 23 and 40 are of a type having a low beta and severe Early effect characteristics. Therefore, compensation circuitry comprising PNP transistors 24, 41, 42 and 43 is provided. Transistor 24 compensates for base loading currents (low betas). Transistor 41 compensates for Early effects. Transistor 42, which is arranged as a diode, sets the voltage bias level for transistors 24 and 41. Transistor 43 provides the base drive for transistors 24 and 41, as well as transistors 23 and 40 through transistor 42, and compensates for base loading.

Transistor 40 is provided with a second collector having a small ratio with respect to the first collector. The second collector supplies added bias current through transistor 42 to ensure an adequate voltage drop to prevent saturation of transistors 23 and 40.

Current control means 21 comprises first and second cross-coupled current mirrors for producing currents through output terminals 11 and 12 of Hall effect element 10, the sum of these currents being set by the current supplied to control means 21 from current mirror 26 through conductor 44. The current supplied through conductor 44 is divided between circuits containing resistors 46 and 47. The principal requirements for resistors 46 and 47 are that they exhibit substantially identical temperature dependencies and that at least one of them be adjustable. Preferably they are laser trimmable thin film resistors which are insensitive to temperature. The relative resistance values of these resistors determine the relative magnitudes of currents through output terminals 11 and 12. Since these resistors are adjustable, the current through output terminals 11 and 12 may be varied to achieve a zero offset voltage for the Hall effect element.

The currents through resistors 46 and 47 are reflected through the cross-coupled current mirrors to Hall effect element output terminals 11 and 12. As the resistors are trimmed to different values, the voltages across the resistors must remain equal in spite of temperature changes. The cross-coupling arrangement provides this characteristic.

A first current mirror comprises NPN transistors 48 and 49 having their base electrodes connected together and their emitter electrodes connected to reference voltage conductor 17. The collector of transistor 48 is connected to resistor 46 and the collector of transistor 49 is connected to output terminal 11. Similarly, the second current mirror comprises NPN transistors 50 and 51 having their base electrodes connected together and their emitters connected to reference voltage conductor 17. The collector of transistor 50 is connected to resistor 47 and the collector of transistor 51 is connected to output terminal 12.

The cross coupling arrangement comprises a third NPN transistor in each of the current mirrors. An NPN transistor 52 has its base electrode connected to the base electrodes of transistsors 48 and 49, its emitter electrode connected to reference voltage conductor 17 and its collector electrode connected to the base electrodes of transistors 50 and 51. The cross coupling arrangement also includes an NPN transistor 53 having its collector electrode connected to supply conductor 15 through a conductor 54, its base electrode connected to the collector electrode of transistor 48 and its emitter electrode connected to the base electrodes of transistors 48, 49 and 52.

Similarly, the second current mirror includes an NPN transistor 55 having its collector electrode connected to the base electrodes of transistors 48, 49 and 52, its base electrode connected to the base electrodes of transistors 50 and 51 and its emitter electrode connected to reference voltage conductor 17. The cross-coupling arrangement also includes an NPN transistor 56 having its collector electrode connected to voltage supply conductor 15 through conductor 54, its base electrode connected to the collector electrode of transistor 50 and its emitter electrode connected to the base electrodes of transistors 50, 51 and 55.

In operation, $I_{E48} = I_{E52} I_{E56}$
$I_{E50} = I_{E55} I_{E53}$
$V_{BE48} = V_{BE56}, V_{BE50} = V_{BE53}$
Thus, $V_{BE48} + V_{BE53} = V_{BE50} + V_{BE56}$
and $V_{R46} = V_{R47}$ As a result of operation of current mirrors 48, 49, 50 and 51, the currents through output terminals 11 and 12 have the same ratio as the currents through resistors 46 and 47 respectively. Further, the sum of the currents through resistors 46 and 47, and therefore, the sum of the currents through output terminals 11 and 12 varies with temperature in the same manner as the current through input terminals 13 and 14. By properly trimming resistors 46 and 47, a null offset voltage between output terminals 11 and 12 can be achieved. Since the total current through output terminals 11 and 12 precisely tracks the current through input terminals 13 and 14 with respect to temperature, the applicant's circuit provides a precise null offset voltage over an extended range of temperatures.

Although only a single embodiment of the present invention has been shown and described for illustrative purposes, various modifications within the applicant's contemplation and teaching will be apparent to those of ordinary skill in the relevant arts. It is not intended that coverage be limited to the embodiment shown, but only by the terms of the appended claims.

The embodiments of the invention in which an exclusive property or right is claimed are defined as follows:

1. An integrated circuit Hall effect device with temperature independent offset compensation, comprising:
    a semiconductor chip with an epitaxial layer thereon;
    a Hall effect element formed in the epitaxial layer, said Hall effect element being operable to produce a voltage difference between first and second terminals thereof when an electric current is caused to flow between third and fourth terminals thereof and said element is subjected to a magnetic field, the voltages at the first and second terminals ideally being equal in the absence of a magnetic field, but being subject to an offset voltage which can be eliminated by causing suitable current to flow through at least one of the first and second terminals;
    a voltage supply conductor;
    a reference voltage conductor;
    first connecting means connecting said Hall effect element through its third and fourth terminals between said voltage supply conductor and said reference voltage conductor;
    a first resistor formed in said epitaxial layer;
    second connecting means connecting said first resistor between said voltage supply conductor and said reference voltage conductor to result in a first current through said second connecting means which is affected by temperature in the same manner as the current through said Hall effect element; and
    current control means connecting said at least one of the first and second terminals of said Hall effect element to one of said voltage supply and reference voltage conductors, said current control means being responsive to the current through said second connecting means to cause said suitable current flow through said at least one of the first and second terminals of said Hall effect element.

2. The integrated circuit Hall effect device of claim 1 wherein said current control means includes a second resistor having substantially zero temperature dependence, said second resistor being variable and operable to vary the current flowing through said at least one of the first and second terminals.

3. The integrated circuit Hall effect device of claim 2 wherein said second connecting means includes a first current mirror for producing a second current proportional to the first current, the current flowing through said at least one of the first and second terminals of said Hall effect element being controlled in response to the second current.

4. The integrated circuit Hall effect device of claim 3 wherein said current control means connects each of the first and second terminals of said Hall effect element to one of said voltage supply and reference voltage conductors, said current control means including a third resistor having substantially zero temperature dependence which, in conjunction with said second resistor, is connected to divide the second current into first and second portions, the currents flowing through the first and second terminals of said Hall effect element being controlled by the first and second portions respectively of the second current.

5. The integrated circuit Hall effect device of claim 4 wherein said second resistor is a laser trimmable thin film resistor formed on said chip.

6. The integrated circuit Hall effect device of claim 5 wherein said current control means includes second and third cross-coupled current mirrors responsive to the first and second portions respectively of the second current for controlling the currents through the first and second terminals of said Hall effect element.

7. The integrated circuit Hall effect device of claim 6 wherein said second and third cross-coupled current mirrors comprise:
    first, second, and third transistors having base electrodes connected together and emitter electrodes connected to said reference voltage conductor, a collector electrode of said first transisto being connected to the first terminal of said Hall effect element, and the collector electrode of said second transistor being connected to said second resistor;
    fourth, fifth and sixth transistors having base electrodes connected together and emitter electrodes connected to said reference voltage conductor, said fourth transistor having a collector electrode connected to the second terminal of said Hall effect element, and a collector electrode of said fifth transistor being connected to said third resistor;

a seventh transistor having a base electrode connected to the collector electrode of said second transistor, an emitter electrode connected to the base electrodes of said first, second and third transistors and to the collector electrode of said sixth transistor, and a collector electrode connected to said voltage supply conductor and an eighth transistor having a base electrode connected to the collector electrode of said fifth transistor, an emitter electrode connected to the base electrodes of said fourth, fifth and sixth transistors and the collector electrode of said third transistor and a collector electrode connected to said voltage supply conductor.

8. A sensing device which can be trimmed to automatically compensate for output signal offset, comprising:

an electrically energizable sensing element including output terminal means, and having a response to a first condition, said sensing element being operable to produce an analog voltage at said output terminal means representative of the first condition, the response of said sensing element being affected by a second condition, offset in said analog voltage being variable by varying current through said output terminal means;

a tracking circuit connected for enerigization in parallel with said sensing element and including a fixed resistor, said sensing element producing an electric current whose magnitude tracks the response of said sensing element with respect to the second condition; and a current control circuit including adjustable resistor means whose resistance is substantially independent of the second condition, said adjustable resistor means being operable to proportion the current produced by said tracking circuit, said current control circuit being connected to the output terminal means of said sensing element and operable to control the current therethrough in response to an adjustable fraction of the current produced by said tracking circuit to vary the voltage offset at the output terminal means.

9. The sensing device of claim 8 wherein:

the output terminal means of said sensing element includes first and second output terminals between which a voltage difference representative of the first condition is produced; and said current control circuit includes first and second current mirrors which control currents through the the first and second output terminals of said sensing element in response to complementary first and second portions respectively of the current produced by said tracking circuit.

10. The sensing device of claim 9 wherein said first and second current mirrors are cross-coupled.

11. The sensing device of claim 10 wherein said sensing element is a Hall effect element.

12. The sensing device of claim 11 wherein said Hall effect element and said fixed resistor are formed in an epitaxial layer on a semiconductor chip.

13. The sensing device of claim 12 wherein said tracking circuit includes a third current mirror which furnishes the current produced by said tracking circuit, the furnished current being proportional to the current through the fixed resistor.

14. A differential current source for producing first and second precise currents whose sum is determined by a control current, comprising:

a voltage supply conductor;

a reference voltage conductor;

first and second output terminals for supplying first and second currents;

a control terminal for receiving a current whose magnitude is indicative of the sum of the currents supplied at said first and second output terminals;

first, second and third transistors having base electrodes connected together and emitter electrodes connected to said reference voltage conductor, said first transistor having a collector electrode connected to said first output terminal and said second transistor having a collector electrode connected to said control terminal through a first resistor;

fourth, fifth and sixth transistors having base electrodes connected together and emitter electrodes connected to said reference voltage conductor, said fourth transistor having a collector electrode connected to said second output terminal and said fifth transistor having a collector electrode connected to said control terminal through a second resistor;

a seventh transistor having an emitter electrode connected to the base electrodes of said first, second and third transistors and to the collector electrode of said sixth transistor, a base electrode connected to the collector electrode of said second transistor and a collector electrode connected to said voltage source conductor; and an eighth transistor having an emitter electrode connected to the base electrodes of said fourth, fifth and sixth transistors and to the collector electrode of said third transistor, a base electrode connected to the collector electrode of said fifth transistor and a collector electrode connected to said voltage supply conductor.

15. The differential current source of claim 14 in which said first resistor is variable.

16. The differential current source of claim 15 wherein said first, second, third, fourth, fifth, sixth, seventh and eighth transistors are NPN transistors formed in an epitaxial layer and said first and second resistors are laser trimmable thin film resistors.

17. A method for providing temperature independent output voltage offset adjustment for a Hall effect element having first and second supply terminals and first and second output terminals, comprising the steps of:

providing a resistor having substantially the same temperature response as the Hall effect element;

supplying the same voltage across the first and second supply terminals of the Hall effect element and across means including the resistor to produce a current through the resistor which tracks current through the Hall effect element with temperature;

dividing the current through the resistor into first and second complementary current portions;

controlling current flow through first and second output terminals of the Hall effect element in response to the first and second current portions respectively; and adjusting the ratio of the first and second current portions to achieve a null voltage between the first and second output terminals when no magnetic field is applied to the Hall effect element.

18. The method of claim 17 wherein the Hall effect element and the resistor are formed in the same epitaxial layer.

* * * * *